United States Patent [19]
Vanmaele et al.

[11] Patent Number: 6,017,673
[45] Date of Patent: Jan. 25, 2000

[54] LITHOGRAPHIC PRINTING PLATE AND TREATING LIQUIDS FOR SUCH PLATE COMPRISING A HYDROPHILIC AMPHORETIC BLOCK COPOLYMER

[75] Inventors: Luc Vanmaele, Lochristi; Lode Deprez, Wachtebeke; Frank Louwet, Diepenbeek, all of Belgium

[73] Assignee: Agfa-Gevaert, N.V., Mortsel, Belgium

[21] Appl. No.: 09/053,015

[22] Filed: Apr. 1, 1998

Related U.S. Application Data

[60] Provisional application No. 60/049,395, Jun. 10, 1997.

[30] Foreign Application Priority Data

Apr. 15, 1997 [EP] European Pat. Off. ............. 97201123

[51] Int. Cl.$^7$ ................................ G03F 7/07; G03C 8/06; G03C 8/28; G03C 8/36
[52] U.S. Cl. .......................... 430/204; 430/227; 430/230; 430/232; 430/229; 101/451; 101/457; 101/465
[58] Field of Search ..................................... 430/204, 227, 430/229, 232, 230; 101/451, 457, 465

[56] References Cited

U.S. PATENT DOCUMENTS

| | | | |
|---|---|---|---|
| 4,033,919 | 7/1977 | Lawson | 260/29.6 |
| 4,116,896 | 9/1978 | Garrett et al. | 101/463 |
| 4,186,250 | 1/1980 | Garrett et al. | 101/465 |
| 5,236,802 | 8/1993 | Yamano et al. | 430/204 |
| 5,437,957 | 8/1995 | Yamano et al. | 430/204 |
| 5,707,775 | 1/1998 | Deprez et al. | 430/204 |

FOREIGN PATENT DOCUMENTS

| | | |
|---|---|---|
| 0 375 159 A1 | 6/1990 | European Pat. Off. . |
| 0 609 891 A2 | 8/1994 | European Pat. Off. . |
| 0 609 891 A3 | 8/1994 | European Pat. Off. . |

*Primary Examiner*—Richard L. Schilling
*Attorney, Agent, or Firm*—Breiner & Breiner

[57] ABSTRACT

A lithographic printing plate that works according to the silver salt diffusion transfer reversal process is disclosed. The lithographic properties of said plate can be improved by incorporating a hydrophilic amphoteric block copolymer, comprising a non-ionic block of acrylic units with pendant nitrile groups and an acrylamid(in)e block which comprises units with pendant basic and acidic groups. The hydrophilic amphoteric block copolymer is preferentially present in the image receiving layer of the lithographic printing plate. In an alternative embodiment, said block copolymer may be present in a treating solution used for processing said plate or applied onto said plate while printing. The hydrophilicity of the printing plate's surface is improved without deteriorating the ink-acceptance in the printing areas.

9 Claims, No Drawings

6,017,673

LITHOGRAPHIC PRINTING PLATE AND TREATING LIQUIDS FOR SUCH PLATE COMPRISING A HYDROPHILIC AMPHORETIC BLOCK COPOLYMER

Benefit is claimed under 35 USC 119(E) from provisional application Ser. No. 60/049,395 filed Jun. 10, 1997.

FIELD OF THE INVENTION

The present invention relates to an imaging element for making a lithographic printing plate according to the silver salt diffusion transfer reversal process.

BACKGROUND OF THE INVENTION

A preferred method of lithographic platemaking uses the so-called directly exposable plates that work according to the silver salt diffusion transfer reversal (DTR) process as such plates are positive-working systems having a high photographic speed compared to the conventional so-called pre-sensitized plates which require intense exposure to ultra-violet light through an intermediate phototypesetting film as exposure mask. Therefore, DTR lithographic printing plates show a high versatility of being imaged by projection cameras directly from the paste-up copy as well as by most commonly available laser image-setters currently used in graphic arts to expose said intermediate phototypesetting films.

The principles of the DTR process have been described e.g. in U.S. Pat. No. 2,352,014 and in the book "Photographic Silver Halide Diffusion Processes" by André Rott and Edith Weyde—The Focal Press—London and New York, (1972). By DTR processing of an information-wise exposed silver halide material, non-developed silver halide present in the photosensitive emulsion layer of the material is transformed with a so-called silver halide solvent into soluble silver complex compounds which are allowed to diffuse into an image receiving layer and are reduced therein with a developing agent, generally in the presence of physical development nuclei, to form a positive silver image having reversed image density values ("DTR image") with respect to the negative black silver image obtained in the exposed areas of the photographic material. In a preferred embodiment, said image receiving layer is present in the same material as the photosensitive layer, thereby forming a so-called mono-sheet DTR material, though two-sheets embodiments are also well known in the art.

A typical lithographic printing plate precursor which is suitable for DTR processing is characterized by a hydrophilic image receiving layer, being water-receptive and non-wettable by ink. The positive silver image, formed after DTR processing at the exposed areas in the image receiving layer of said printing plate, is hydrophobic and its ink-receptivity is further enhanced by hydrophobizing agents which are present in the processing solution(s). Thus after DTR processing, the exposed areas of the obtained lithographic printing plate are hydrophobic, ink-receptive printing areas and the unexposed areas are hydrophylic, water-receptive non-printing areas.

Besides a high printing endurance and stringent photographic specifications such as high contrast and resolving power, suitable DTR lithographic printing plates have to meet rigid requirements with regard to the so-called ink/water balance of the plate, i.e. a good ink-acceptance at the printing areas as well as no ink-acceptance at the non-printing areas. Especially ink-acceptance by non-printing areas, a deficiency called 'staining', is unacceptable as it results in incorrect prints. When staining occurs during start-up of the printing process, it is often called 'toning' and the term 'scumming' may be used for the occurrence of staining during the printing process. Toning results in a high number of copies that have to be disposed of before an acceptable print is obtained, which is a major disadvantage especially for low printing runs. Also a poor ink-acceptance at the printing areas may result in a high number of useless copies during start-up. Printing plates characterized by such a poor 'inking-up' quality need a high number of unacceptable copies before a steady, perfect black print is obtained.

There is a particular need for DTR lithographic printing plates characterized by a higher hydrophilicity in the non-printing areas without deteriorating the ink-acceptance of these plates in the printing areas in order to address the following problems. While starting up the lithographic printing process, the printing plates often have to be moisturized manually which is difficult to achieve for large format four colour presses due to lack of time or geometric restrictions. Furthermore, DTR lithographic printing plates are less hydrophilic than the conventional pre-sensitized lithographic plates and therefore require dedicated dampening liquids. It would be advantageous to enable users to apply the same dampening liquids to both types of plates. Another demand for DTR lithographic printing plates is compatibility with conventional processing equipment that is coupled in line with image-setters used to expose phototypesetting film. Such processors generally comprise three 'wet' sections, i.e. a developing, a fixing and a rinsing section through which the material passes before entering the dryer. When such processing equipment is used for directly exposable DTR lithographic printing plates, the developing and fixing section are filled with respectively an alkaline processing liquid and a neutralizing liquid. Rinsing is a superfluous step in the processing cycle of DTR lithographic printing plates. The additional rinsing section in said conventional processing equipment prevents that the neutralizing liquid, which normally remains on the plate's surface, dries up into the layers of the plate and as a result, the total hydrophobicity of the plate's surface increases when compared with a dedicated DTR processing equipment which does not comprise a rinsing section.

For the reasons mentioned above, it would be advantageous to provide DTR lithographic printing plates having a surface characterized by a higher hydrophilicity in the non-printing areas provided that the ink-acceptance in the printing areas is not affected adversely. It is known in the art that the hydrophilicity of a DTR printing plate's surface is highly determined by the nature of the polymer binders in the image receiving layer. Useful examples of suitable polymer binders are hydrophilic polymer derivatives of acrylic and methacrylic acid. The hydrophilicity of such (meth)acrylic polymers can range from low (e.g. polyacrylonitrile) over medium (e.g. crosslinked polyacrylic acid) to very high (e.g. water-soluble polyacrylate salts or polyacrylamide). U.S. Pat. No. 5,236,802 and EP-A-769, 722 disclose that the presence of polyacrylamide in the image receiving layer of DTR lithographic printing plates enhances the hydrophilicity of the plate's surface and accordingly reduces the occurrence of staining.

The presence of polymer binders characterized by a high hydrophilicity such as polyacrylonitrile however render the printing areas less hydrophobic and reduce the inking-up quality of the plate. Therefore, the prior art materials still need to be improved with regard to the ink/water balance.

STATEMENT OF THE INVENTION

It is an object of the present invention to improve the hydrophilicity of the surface of DTR lithographic printing plates in the non-printing areas without deteriorating the ink-acceptance in the printing areas so as to optimize the lithographic performance of such plates.

Further objects and advantages of the invention will become apparent from the description hereinafter.

The above mentioned objects are realised by a DTR imaging element for making a lithographic printing plate that comprises a hydrophilic amphoteric block copolymer having the specific features according to appending claim 1 and/or by treating said DTR imaging element with a solution containing said hydrophilic amphoteric block copolymer. Preferred embodiments of the invention are disclosed in the dependent claims.

DETAILED DESCRIPTION OF THE INVENTION

The hydrophilic amphoteric block copolymers used according to the present invention are acrylic polymers characterized by three essential features, which will be explained hereinafter. The term "acrylic" as used herein designates any derivative of the acrylic acids having a basic structure $CH_2=CR-COOH$ regardless the nature of the substituent R. Preferred acrylic monomers are derivatives of acrylic acid (R=H) and methacrylic acid ($R=CH_3$).

The acrylic polymer derivatives used according to the present invention are so-called amphoteric polymers carrying both anionic and cationic groups in the same polymer chain. Such ionic groups are capable of mutual interactions which provide the polymer with certain special properties: pH dependant swelling, pH dependant crosslinking, etc. Amphoteric polymers form internal salts at a certain well defined pH value called isoelectric point and accordingly, the polymer in this state has a minimum solubility and/or swelling in water. In this respect, amphoteric (meth) acrylates are analogous to proteins and other natural polymers such as gelatin.

A first essential feature of the hydrophilic amphoteric block copolymers used according to the present invention is the presence of a non-ionic block comprising a sequence of units having pendant nitrile groups according to formula I

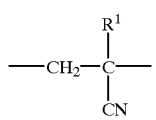

Formula I wherein $R^1$ is hydrogen, alkyl or substituted alkyl. This non-ionic block may be a continuous sequence of the same monomer so as to form a homopolymer, preferably polyacrylonitrile or polymethacrylonitrile, but may also be a random polymer of e.g. acrylonitrile and methacrylonitrile units. The number of units comprised in said non-ionic block is two or more, but preferably at least about ten. According to the present invention, the units of formula I may be separated from one another by other non-ionic acrylic co-monomers without a pendant nitrile group. The ratio of such non-CN co-monomers versus the monomers according to formula I may be as high as 50% but preferably the amount of non-CN co-monomers is kept below 15 molar % for optimum results.

A second essential feature of the hydrophilic amphoteric block copolymers used according to the present invention is the presence of a so-called acrylamid(in)ic block comprising a sequence of acrylamidic or acrylamidinic units corresponding to formula II

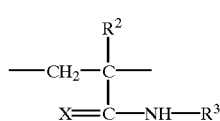

Formula II wherein $R^2$ is hydrogen, alkyl or substituted alkyl, preferably hydrogen or methyl, $R^3$ is hydrogen, alkyl or substituted alkyl, aryl or substituted aryl, and X is O or NH. This sequence of acrylamides or acrylamidines may be a homopolymer or a random polymer. The acrylamid(in)ic units may be N-substituted. The N-substituent $R^3$ can be a carrier of various functional groups, including the acidic and basic groups referred to hereinafter. Hydrophobic moieties can also be present in this acrylamid(in)ic block, obtained by N-substitution with $R^3$ being a non-polar substituent such as an alkyl with 4 to 24 carbon atoms, an aryl group, oxygen containing substituents such as hydroxyl, esters, saccharides or epoxides, an alkylsiloxane $-(Si(R)_2-O)_n-Si(R)_3$ where n is 0 to about 100 and R is an alkyl with 4 to 24 carbon atoms. When $R^3$ is an alkyl or aryl group, it may be substituted with e.g. one or more halogen atoms, lactone, lactame, nitrile, nitro or nitroso groups.

The third essential feature of the hydrophilic amphoteric block copolymers used according to the present invention is the presence of acrylic units having pendant acidic groups as well as acrylic units having pendant basic groups within the acrylamid(in)ic block(s). The acidic and basic groups may be randomly distributed over some or all of the acrylamid (in)ic blocks of the polymer. Each of said acrylamid(in)ic blocks may contain either only acidic groups, only basic groups or a mixture of acidic and basic groups. The polymers used according to the present invention can have a molar excess of either group, thus having isoelectric points at either alkaline or acidic pH, depending on the molar ratio between the basic groups and acidic groups which may vary from about 1:20 to about 20:1, but preferably from about 1:10 to about 10:1. Because of their strong mutual interactions, the acidic and basic groups affect the properties of the polymer already at very low concentrations (as low as 1 molar %), but preferably the concentration of ionic groups is higher than 5 molar %.

In a preferred embodiment, the units having pendant acidic groups are of the general formulae III or IV or are salts thereof. If present as a salt, preferred counterions are metallic ions or nitrogen containing bases.

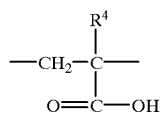

Formula III wherein $R^4$ is hydrogen, alkyl or substituted alkyl. Preferably, $R^4$ is hydrogen or methyl.

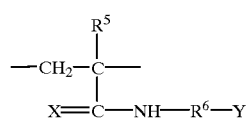

Formula IV wherein $R^5$ is hydrogen, alkyl or substituted alkyl, preferably hydrogen or methyl, X is O or NH, $R^6$ is an organic linking group having at least one carbon atom, preferably ethylene or substituted ethylene, and Y is —COOH, —OPO$_3$H$_2$, —SO$_3$H or —OSO$_3$H.

The units having pendant basic groups are preferably of the general formulae V or VI or are salts thereof. If present as a salt, the counterions may be e.g. carboxylate, sulphate, sulphonate, phosphate, nitrate, nitrite, carbonate or halide.

Formula V

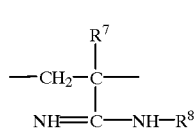

wherein $R^7$ is hydrogen, alkyl or substituted alkyl, preferably hydrogen or methyl, and $R^8$ is hydrogen, alkyl or substituted alkyl, aryl or substituted aryl. Formula V is limited to amidines, as amides are generally not being considered basic.

Formula VI

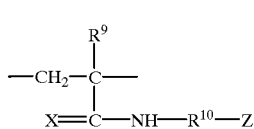

wherein $R^9$ is hydrogen, alkyl or substituted alkyl, preferably hydrogen or methyl, X is O or NH, $R^{10}$ is an organic linking group having at least one carbon atom, preferably ethylene or substituted ethylene, and Z is a nitrogen containing base. Preferred examples of such nitrogen containing bases are primary, secondary and tertiary amines, quaternary bases, pyridine or naphtyridine derivatives, guanidines, amidines, imines and imidines.

When X=NH in formula IV, the unit corresponds also to formula V thereby illustrating that such a unit comprises acidic groups (Y) as well as basic groups (the amidine function). As a result units having a pendant group —CNH—NH—R$^6$—Y are amphoteric per se. Therefore, a block copolymer with a polyacrylonitrile block of formula I and an acrylamid(in)ic block of formula II comprising units with the pendant group —CNH—NH—R$^6$—Y as sole ionic units within said acrylamid(in)ic block are also hydrophilic amphoteric block copolymers within the scope of the present invention.

A highly preferred example of a specific hydrophilic amphoteric block copolymer used according to the present invention is a polymer, referred to herein as Plm-1, comprising N-(2-sulphoethyl)-acrylamide and N-(2-sulphoethyl)-acrylamidine. Plm-1 may be represented by formula VII:

above should not be interpreted literally. The brackets are used to indicate that the acrylonitrile units are organized in separate blocks other than the blocks containing the acrylamide and acrylamidine units. In addition, the five different units present in the acrylamid(in)e block of formula VII are not organized within the blocks in the exact sequence as given above but are randomly distributed over the acrylamid (in)ic blocks. The frequency distribution of the units of Plm-1 is approximately as follows:

| Pendant group | Frequency |
| --- | --- |
| —CN | 19% |
| —CO—NH—CH$_2$—CH$_2$—SO$_3$$^-$ and —CNH—NH—CH$_2$—CH$_2$—SO$_3$$^-$ | 45% |
| —CO—NH$_2$ and —CNH—NH$_2$ | 24% |
| —COO$^-$ | 12% |

The hydrophilic amphoteric polymers used according to the present invention can be synthesized according to the methods disclosed in U.S. Pat. Nos. 5,252,692 and 4,943, 618 which are enclosed herein by reference. A preferred method is the hydrolysis of the CN groups of polyacrylonitrile dissolved in a mixture of a solvent, a primary amine, water and an optional basic catalyst. If the reaction conditions are suitably selected, the hydrolysis of the CN groups proceeds via a so-called "zipper mechanism", which may lead to structures as indicated in formula VII with various substituents being organized in blocks rather than being randomly distributed along the polymer chain. The resulting block copolymers may optionally be covalently or physically crosslinked and may form hydrogels as they are swellable rather than soluble in water. The average molecular weight is typically 150,000 though block copolymers with a much higher or much lower molecular weight can also be used according to the present invention.

The very significant effect of the polymers used according to the present invention upon the lithographic properties of the imaging element comprising such a polymer will be illustrated by the examples. Due to its unique structure, said polymers may reversibly adopt an appropriate conformation so as to improve either water- or ink-acceptance and may facilitate the penetration of compounds present in e.g. developing, neutralizing or dampening liquids which is particularly advantageous when the liquids applied on the plate are not fresh but more or less exhausted.

According to the present invention, a lithographic printing plate is obtained by DTR processing a mono-sheet imaging element comprising a support, a photosensitive silver halide emulsion layer and an image receiving layer comprising physical development nuclei. The hydrophilic amphoteric block copolymers described above are preferably present in a layer of the imaging element and most preferably in the Formula VII

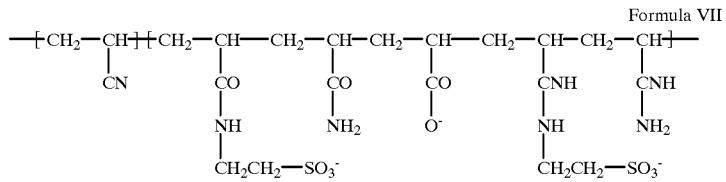

It is generally understood in the art that it is impossible to characterize specific polymers with a single, clear and concise structural formula. Therefore, the formula given image receiving layer. The amount of such hydrophilic amphoteric block copolymer may range from 0.05 up to 200 mg/m$^2$, more preferably from 0.5 to 10 mg/m$^2$ and most preferably from 1 to 5 mg/m$^2$. Said hydrophilic amphoteric block copolymer can also be present in one or more treating solutions applied onto said imaging element. Examples of such treating solutions include processing solutions applied after information-wise exposing the image element so as to obtain a lithographic printing plate and lithographic solutions applied onto said plate while printing. Examples of processing solutions are alkaline processing liquids, e.g. developers or activators, neutralizing liquids (also called stabilizing liquids), rinsing liquids and finishers. After processing the imaging element, a correcting agent may be applied on undesired printing areas, e.g. when the original contains undesired images or have dust, dirty powders, finger prints or other stains or when shadows are produced by the exposure of a laminated original. Within the present application, the correcting agent will also be considered as a processing solution. Examples of lithographic solutions are starter and dampening liquids (the latter are also called fountains). The above mentioned treating solutions will be described in more detail hereinafter.

Two preferred embodiments of a mono-sheet DTR lithographic printing plates will be described in the present disclosure. According to a first type, disclosed in e.g. U.S. Pat. No. 4,722,535 and GB 1,241,661, an imaging element is provided comprising a support and coated thereon in the order given a silver halide emulsion layer and an image receiving layer containing physical development nuclei in water permeable relationship with said emulsion layer. Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

Supports suitable for use in said imaging elements may be opaque or transparent, e.g. a paper support or resin support. When a paper support is used, preference is given to one coated at one or both sides with an alpha-olefin polymer, e.g. a polyethylene layer which optionally contains an antihalation dye or pigment. It is also possible to use an organic resin support e.g. cellulose nitrate film. cellulose acetate film, poly(vinyl acetal) film, polystyrene film, poly(ethylene terephthalate) film, polycarbonate film, polyvinylchloride film or poly-alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al. in "Making and Coating Photographic Emulsion", The Focal Press, London (1966). The emulsion or emulsions preferably consist principally or totally of silver chloride while a fraction of silver bromide may be present ranging from 0.1 mole % to 40 mole %. When the fraction of silver bromide is 5% or more, the emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated. The average size of the silver halide grains may range from 0.10 to 0.70 μm, preferably from 0.25 to 0.45 μm. Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5 \times 10^{-7}$ and $10^{-5}$ mole per mole of $AgNO_3$.

The silver halide emulsions may be chemically sensitised according to the procedures described in e.g. "Chimie et Physique Photographique" by P. Glafkides, in "Photographic Emulsion Chemistry" by G. F. Duffin, in "Making and Coating Photographic Emulsion" by V. L. Zelikman et al, and in "Die Grundlagen der Photographischen Prozesse mit Silberhalogeniden" edited by H. Frieser and published by Akademische Verlagsgesellschaft (1968). As described in said literature chemical sensitisation can be carried out by effecting the ripening in the presence of small amounts of compounds containing sulphur, selenium or tellurium e.g. thiosulphate, thiocyanate, thiourea, selenosulphate, selenocyanate, selenoureas, tellurosulphate, tellurocyanate, sulphites, mercapto compounds, and rhodamines. In a preferred embodiment, these compounds are applied in combination with a noble metal salt, preferably a gold complex salt, but also salts of platinum, palladium and iridium as described in U.S. Pat. No. 2,448,060 and British Patent No. 618,061 may be used. Additions of sulphur and/or selenium and/or tellurium and gold may be carried out consecutively or simultaneously. In the latter case the addition of goldthiosulphate, goldselenosulphate or goldtellurosulphate compounds may be recommended. Optionally, small amounts of compounds of Rh, Ru, Pb, Cd, Hg, or Tl can be added. Also reductors may be added as chemically sensitizing agents, e.g. tin compounds as described in British Patent No. 789 823, amines, hydrazine derivatives, formamidinesulphinic acids, and silane compounds. The chemical sensitisation can also proceed in the presence of phenidone and/or its derivatives, a dihydroxybenzene as hydroquinone, resorcinol, catechol and/or a derivative(s) thereof, one or more stabiliser(s) or antifoggant(s), one or more spectral sensitiser(s) or combinations of said ingredients.

The silver halide emulsions of the DTR element can be spectrally sensitized according to the spectral emission of the exposure source for which the DTR element is designed. Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes. In the case of a conventional light source, e.g. tungsten light, a green sensitizing dye is needed. In case of exposure by an argon ion laser a blue sensitizing dye is incorporated. In case of exposure by a red light emitting source, e.g. a LED or a He/Ne laser, a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888. A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. Nos. 4,092,168; 4,311,787 and DE-P 2,453,217.

More details about the composition, preparation and coating of silver halide emulsions can be found in e.g. Product Licensing Index, Vol. 92, December 1971, publication 9232, p. 107–109.

The image receiving layer can be free of hydrophilic binder but preferably comprises a hydrophilic amphoteric block copolymer as used in the present invention. Besides said block copolymer, the image receiving layer may contain other hydrophilic colloids such as polyvinyl alcohol up to an amount of about 80% by weight of the total weight of said layer. Other suitable hydrophilic polymer binders have been disclosed in e.g. U.S. Pat. Nos. 3,728,114; 4,160,670; 4,606,985; 4,510,228; 4,743,525; 4,879,193; 5,153,097; 5,108,871; 5,041,354. EP-A-715,211 and 751,429 disclose an image receiving layer comprising a colloidal clay in order to improve the lithographic properties of DTR plates.

The image receiving layer further contains physical development nuclei. Preferred physical development nuclei are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form. As disclosed in EP-A-546,598 the physical development nuclei preferably have a narrow size distribution.

Between the support and the silver halide emulsion layer there is preferably provided a base layer that preferably contains an anti-halation substance such as e.g. light-absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. This layer can further contain hardening agents, matting agents, e.g. silica particles, and wetting agents. Suitable matting agents preferably have an average diameter of 2–10 $\mu$m and more preferably between 2 $\mu$m and 5 $\mu$m. The matting agents are generally used in a total amount in the imaging element of 0.1 g/m$^2$ to 2.5 g/m$^2$. At least part of these matting agents and/or light reflection pigments may also be present in the silver halide emulsion layer and/or in the cover layer. As a further alternative the light reflecting pigments may be present in a separate layer provided between the antihalation layer and the photosensitive silver halide emulsion layer. Like the emulsion layer the base layer is coated preferably at a pH value near the isoelectric point of the gelatin in the base layer.

In the present embodiment a backing layer preferably is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the Theological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the imaging element, especially when the binder used is gelatin, can be hardened with appropriate hardening agents such as those of the vinylsulphone type e.g. methylenebis(sulphonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952. Preferably used hardening agents are of the aldehyde type. The hardening agents can be used in a wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present embodiment may further comprise various kinds of surface-active agents in the silver halide emulsion layer or in at least one other hydrophilic colloid layer. Examples of suitable surface-active agents are described in e.g. EP 545452. Preferably compounds containing perfluorinated alkyl groups are used. The imaging element of the present embodiment may further comprise various other additives such as e.g. compounds improving the dimensional stability of the imaging element, UV-absorbers, spacing agents and plasticizers.

Suitable additives for improving the dimensional stability of the imaging element are e.g. dispersions of a water-soluble or hardly soluble synthetic polymer e.g. polymers of alkyl (meth)acrylates, alkoxy(meth)acrylates, glycidyl (meth)acrylates, (meth)acrylamides, vinyl esters, acrylonitriles, olefins, and styrenes, or copolymers of the above with acrylic acids, methacrylic acids, alpha-betaunsaturated dicarboxylic acids, hydroxyalkyl (meth) acrylates, sulphoalkyl (meth)acrylates, and styrene sulphonic acids.

The imaging element can be information-wise exposed in an apparatus using a camera-exposure or a scanning exposure according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element can also be exposed with the aid of cathode rays tubes and laser recorders or laser image-setters. The laser sources used comprise e.g. He/Ne or Ar gas lasers and red or infrared semiconductor lasers emitting in the wavelength range from 600 to 1500 nm.

The processing liquid used for developing the DTR imaging element are alkaline solutions which contain a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulphates. Silver halide solvents that are preferably used in connection with the present invention are thiocyanates and alkanolamines. Preferred alkanolamines are of the tertiary, secondary or primary type corresponding to the following formula:

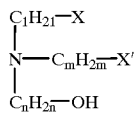

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, etc. or mixtures thereof. The alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

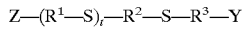

wherein Z and Y each independently represents hydrogen, an alkyl group, an amino group, an ammonium group, a hydroxyl, a sulpho group, a carboxyl, an aminocarbonyl or an aminosulphonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates. Preferably at least part and more preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l. However the meso-ionic compound may be incorporated in one or more layers comprised on the support of the imaging element. The meso-ionic compound is in that case preferably contained in the imaging element in a total amount between 0.1 and 10 mmol/m$^2$, more preferably between 0.1 and 5 mmol/m$^2$ and most preferably between 0.5 and 1.5 mmol/m$^2$. More details are disclosed in EP-A-0,554,585.

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain (a) developing agent(s). In that case the processing liquid is called a developer. In another embodiment, some or all of the developing agent(s) may be present in one or more layers of the imaging element. When all of the developing agents are contained in the imaging element the processing liquid is called an activator or activating liquid. Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the imaging element are 1-phenyl-3-pyrazolidones of which the aqueous solubility is increased by a hydrophilic substituent such as e.g. hydroxy, amino, carboxylic acid group, sulphonic acid group etc. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used. At least the auxiliary developing agents are preferably incorporated into the imaging element, preferably in the silver halide emulsion layer of the imaging element, in an amount of less than 150 mg/g of silver halide expressed as AgNO$_3$, more preferably in an amount of less than 100 mg/g of silver halide expressed as AgNO$_3$.

The alkaline processing liquid used for developing an imaging element may also contain hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728 and U.S. Pat. No.

4,563,410. Preferred compounds correspond to one of the following formulae:

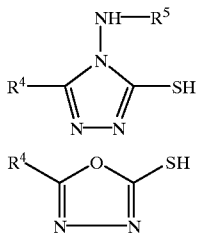

wherein $R^5$ represents hydrogen or an acyl group, $R^4$ represents alkyl, aryl or aralkyl. Most preferably used compounds are compounds according to one of the above formulae wherein $R^4$ represents an alkyl containing 3 to 16 C-atoms.

The hydrophobizing agents preferably are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid preferably also contains a preserving agent having anti-oxidation activity, e.g. sulphite ions provided e.g. by sodium or potassium sulphite. For example, the aqueous solution comprises sodium sulphite in an amount ranging from 0.15 to 1.0 mole/l. The alkaline processing liquid may further contain a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. It is furthermore preferred to add a spreading agent or surfactant in order to assure equal spreading of the alkaline processing liquid over the surface of the imaging element. Such a surfactant should be stable at the pH of the alkaline processing liquid and should assure a fast overall wetting of the surface of the imaging element. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components. Development acceleration can be accomplished by addition of various compounds to the alkaline processing liquid and/or one or more layers of the imaging element, preferably polyalkylene derivatives having a molecular weight of at least 400 such as those described in e.g. U.S. Pat. Nos. 3,038,805; 4,038,075; 4,292,400 and 4,975,354.

Subsequent to the development in an alkaline processing liquid, the surface of the printing plate is preferably neutralized using a neutralization liquid, which is also called a stabilizer or stabilizing liquid. A neutralization liquid generally has a pH between 5 and 8. The neutralization liquid preferably contains a buffer e.g. a phosphate buffer, a citrate buffer or mixture thereof. The neutralization liquid can further contain bactericides, substances which influence the ink/water balance of the printing plate obtained after processing of the DTR element, e.g. hydrophobizing agents as described above, silica and wetting agents, preferably compounds containing perfluorinated alkyl groups.

After the neutralization step, the imaging element may optionally be rinsed with water. The rinsing water may comprise additives such as surface active ingredients or compounds which prevent growth of algae. After drying, a first embodiment of a lithographic plate which works according to the DTR mechanism is thus obtained.

According to another embodiment in accordance with the present invention, a lithographic printing plate can be obtained by means of the DTR process using an imaging element comprising in the order given a hydrophilic surface of a support, a layer containing physical development nuclei and a silver halide emulsion layer. Said hydrophilic surface of a support can be a hardened hydrophilic layer, containing a hydrophilic binder and a hardening agent coated on a flexible support, e.g. a paper support or a resin support as described above.

Such hydrophilic binders are disclosed in e.g. EP-A 450,199, which is incorporated herein by reference. Preferred hardened hydrophilic layers comprise partially modified dextrans or pullulan hardened with an aldehyde as disclosed in e.g. EP-A 514,990 which also is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

Said hydrophilic surface of a support can also be a hydrophilic metallic support e.g. an aluminum foil. The aluminum support of the imaging element for use in accordance with the present embodiment can be made of pure aluminum or of an aluminum alloy, the aluminum content of which is at least 95%. The thickness of the support usually ranges from about 0.13 to about 0.50 mm. The preparation of aluminum or aluminum alloy foils for lithographic printing comprises the following steps: graining, anodizing, and optionally sealing of the foil. Graining and anodization of the foil are necessary to obtain a lithographic printing plate that allows to produce high-quality prints. Sealing is not necessary but may still improve the printing results. Preferably the aluminum foil has a roughness with a CLA value between 0.2 and 1.5 μm, an anodization layer with a thickness between 0.4 and 2.0 μm and is sealed with an aqueous bicarbonate solution. More details on the preparation of a grained, anodized and sealed aluminum foil are given in U.S. Pat. No. 3,861,917 and in the documents referred to therein.

To promote the image sharpness and, as a consequence thereof, the sharpness of the final printed copy, the anodization layer may be coloured in the mass with an antihalation dye or pigment e.g. as described in JA-Pu-58-14,797.

The silver halide emulsion and the physical development nuclei are characterized by the same features as described above. As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPas at a shearing rate of $1000\ s^{-1}$ combined with a gelatin of a higher viscosity. The weight ratio of said low viscosity gelatin versus the gelatin of a higher viscosity is preferably >0.5.

Preferably the gelatin layer(s) is(are) substantially unhardened. Substantially unhardened means that when such gelatin layer is coated on a subbed polyethylene terephtalate film base at a dry thickness of 1.2 g/m², dried for 3 days at 57° C. and 35% R.H. and dipped in water of 30° C., said gelatin layer is dissolved for more than 95% by weight within 5 minutes.

The imaging element of the present embodiment may be imaged using a camera-exposure or a scanning exposure as described above followed by a development step in the presence of development agent(s) and silver halide solvent (s) as described above so that a silver image is formed in the physical development nuclei layer. Subsequently the silver halide emulsion layer and any other optional hydrophilic layers are removed by e.g. rinsing the imaged element with water, preferably having a temperature between 30° C. and 50° C. so that the silver image is exposed.

To facilitate the removal of the silver halide emulsion layer it is advantageous to provide a layer between the layer containing physical development nuclei and the silver halide emulsion layer comprising a hydrophilic non-proteinic film-forming polymer e.g. polyvinyl alcohol, polymer beads e.g. poly(meth)acrylate beads, particles of a water insoluble inorganic compound having a number average size not lower than 0.1 μm, alkali insoluble non-polymeric organic compounds having a melting point of at least 50° C. and a number average size between 0.1 μm and 10 μm and particles of an alkali insoluble polymer obtainable by polycondensation with a number average size between 0.02 μm and 10 μm. Such type of layers are disclosed in EP-A-483415, EP-A-410500, EP-A-723195, EP-A-750227 and EP-A-95203052.6.

Finally said exposed imaged surface of the hydrophilic support is treated with a composition often called finisher, which comprises at least one compound enhancing the ink-receptivity and/or lacquer-receptivity of the silver image and at least one compound that improves the ink-repelling characteristics of the hydrophilic surface. Suitable ingredients for the finisher are e.g. organic compounds containing a mercapto group such as the hydrophobizing compounds referred to hereinbefore for the alkaline processing liquid. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkish red oil may be added.

A second embodiment of a lithographic printing plate which works according to the DTR mechanism is thus obtained.

It is often necessary to make corrections on the lithographic printing plates before the printing process can be started, or even during the printing job. In the case of silver imaged lithographic printing plates, said corrections require that portions of silver imaged oleophilic ink-receptive areas of the plate are converted into hydrophilic ink-rejecting areas by applying to said areas a reactive composition called 'correcting agent', 'deletion fluid' or 'deletion liquid', 'correcting fluid' or 'correcting liquid', or briefly 'corrector'. In one embodiment, the correcting agent is a liquid being applied with the aid of a felt-tip correcting pen comprising a container which is filled with the correcting agent. An alternative embodiment is a correcting gel, being a correcting liquid containing a thickening agent.

The correcting agents are aqueous solutions or water-solvent mixtures comprising reactive compounds and can be classified in two types according to the underlying chemical principles. One type renders the silver imaged areas of the developed lithographic printing plate hydrophylic, i.e. ink-rejecting, without removing the DTR silver image. A second type works according to the bleach-fixing mechanism: a bleaching compound, preferably an iron (III) salt, oxidizes the silver image in the presence of a fixing compound, i.e. a silver halide solvent, which is preferably a thiosulphate. Bleach-fixing correcting agents are generally preferred because the stability of the hydrophilicity of the areas deleted by correcting agents of the first type is not retained as well as by correcting agents of the second type. Correcting agents are disclosed in e.g. U.S. Pat. No. 4,837,122 and unpublished EP-A 95,203,493.

After image-wise exposure, processing and optionally correcting, the DTR lithographic printing plate obtained is mounted on an offset printing press. Lithographic printing is carried out by feeding both an aqueous solution and oleophilic coloured ink to the printing plate surface to allow the image areas to receive preferentially the coloured ink and the non-image areas preferentially water and then transferring the ink deposited on image areas onto a substrate such as paper for example. Said aqueous solution is called a fountain or dampening liquid and generally contains a sizable amount of a transparent pigment, usually colloidal siliciumdioxide, and a buffer to stabilize the pH within a certain range, e.g. from 3 to 6. Dampening liquids are disclosed in e.g. in U.S. Pat. Nos. 3.829,319; 4,238,279; EP-A 304,662 and 754,565.

When toning occurs during start-up of the printing job or when the lithographic printing plate has been processed in weak or exhausted processing liquids, the use of a starter liquid may be necessary. By applying such a starter liquid to the plate, an additional amount of hydrophobizing agent and/or siliciumdioxide may be provided so as to suppress toning.

While the present invention will hereinafter be described in connection with preferred embodiments thereof, it will be understood that it is not intended to limit the invention to those embodiments.

EXAMPLES

Preparation of the Silver Halide Emulsion Coating Solution

A silver chlorobromide emulsion composed of 98.2 molar % of chloride and 1.8 molar % of bromide was prepared by the double jet precipitation method. The average silver halide grain size was 0.38 μm (diameter of a sphere with equivalent volume) and contained rhodium ions as internal dopant. The emulsion was ortho-chromatically sensitized and stabilized by a 1-phenyl-5-mercaptotetrazole.

Preparation of the Imaging Elements

A polyethylene terephthalate film support having a thickness of 175 μm and being provided with a adhesion improving layer was coated with a layer containing gelatin in an amount of 0.4 g/m² and colloidal silica having an average particle diameter of 7 nm in an amount of 0.4 g/m². The adhesion improving layer contained a copolymer of itaconic acid (2%), vinylidene chloride (88%) and methylmethacrylate (10%). An emulsion prepared as described above was coated onto this polyethylene terephthalate film support together with an anti-halation layer such that the amount of gelatin was 2.8 g/m² in the anti-halation layer and 1.34 g/m² in the silver halide emulsion layer. The amount of silver halide expressed as $AgNO_3$ was 1.25 $g/m^2$ and the emulsion layer further contained developing agents, a silica matting agent and 150 $mg/m^2$ of formaldehyde as a hardener. The anti-halation layer further contained $BaSO_4$-particles having a size smaller than 800 nm (4 $g/m^2$) in combination with carbon black. The anti-halation layer was substantially free of matting agent. The thus obtained element was kept at 57° C. at a relative humidity of 34% for 1 day and then divided into five different samples.

To each of these samples was then coated an image receiving layer of PdS nuclei prepared as described in EP-545,453. Each of the coating solutions of the image receiving layer contained an amount of hydrophilic polymer, added as a solid substance, as indicated in table 1, together with a synthetic clay (laponite RD, trade mark products of LAPORTE INDUSTRIES Limited, London) in an amount of 2 $mg/m^2$. This surface layer also contained 0.4 $g/m^2$ of hydroquinone and was substantially free of any hardening. The samples were then stored for 1 day at 57° C. at a relative humidity of 34%.

Preparation of the Treating Solutions

The following alkaline processing liquid was prepared:

| | |
|---|---|
| sodium hydroxide | 30 g |
| methylhydroquinone | 2 g |
| sodium sulphite anhydrous | 35 g |
| 2-aminoethyl-aminoethanol | 45 ml |
| 1,4-dimethyl-5-(3-butenyl)-1,2,4-triazolium-3-thiolate | 0.8 g |
| EDTA, tetra-sodium salt | 1 g |
| 3-mercapto-5-n.heptyl-oxa-3,4-diazole | 0.35 g |
| water to make | 1 l |

The following neutralization liquid was prepared:

| | |
|---|---|
| citric acid | 5.4 g |
| non-ionic surfactant | 200 mg |
| $NaH_2PO_4$ | 1.1 g |
| $KH_2PO_4$ | 38.3 g |
| $Na_2SO_3$ | 4 g |
| tri-ethanolamine | 10 ml |
| 1-(N(n.$C_4H_9$)$_2COCH_2$)-5-mercapto-1,2,3,4-tetrazole | 800 mg |
| sodiumbenzoate | 1 g |
| turpinal 2NZ [a] | 1 g |
| EDTA, tetra-sodium salt | 1 g |
| water to make | 1 l |
| pH was adjusted to 5.9 | |

[a] Turpinal 2NZ is a trade name of Henkel, Belgium for 1-hydroxy-ethylidene-diphosphonic acid, disodium salt.

The following dampening liquid was prepared:

| | |
|---|---|
| water | 880 ml |
| citric acid | 6 g |
| boric acid | 8.4 g |
| sodium sulphate, anhydrous | 25 g |
| ethyleneglycol | 100 g |
| colloidal silica | 28 g |

Test Procedure and Results

Table 1 lists the test results of the five samples prepared as described above. Sample no. 1 contained no hydrophilic polymer in the image receiving layer. Sample no. 2 contained a homopolymer of acrylamide, in table 1 referred to as "PAA", and sample no. 3 contained a random copolymer, in table 1 referred to as "PANS", consisting of approximately 20% acrylamide and 80% N-substituted acrylamide carrying the anionic sulphonate pendant group —CO—NH—$C(CH_3)_2$—$CH_2$—$SO_3$. Samples no. 4 and 5 contained a polymer according to the present invention, namely Plm-1 which has been defined hereinbefore.

These samples were image-wise exposed and processed at 30° C. with the above described alkaline processing liquid, subsequently neutralized at 25° C. with the neutralization liquid described above, rinsed with water and dried. The printing plates thus prepared were mounted on a two-colour GTO offset printing machine. The printing press was equipped with a clamp system for mounting the plates. The inks used were commonly employed inks. The fountain used during the printing run was obtained by diluting the dampening liquid described above to an amount of 1.5% by volume. The "toning" quality of the samples was evaluated by counting the number of copies that had to be disposed of before a steady, tone-free print could be obtained. The results in table 1 indicate that the hydrophilic amphoteric block copolymer Plm-1 used according to the present invention significantly reduces the number of copies to be disposed of due to toning.

In order to evaluate the ink-acceptance of the samples, the following procedure was followed. The above described imaging elements were image-wise exposed and processed at 30° C. with the above described alkaline processing liquid, subsequently neutralized at 25° C. with the neutralization liquid described above (pH adjusted to 8.5) and dried. The printing plates thus prepared were mounted on a ABDICK9860 offset printing machine. As a black ink was used ABDICK1020. The fountain used during the printing run was obtained by diluting the dampening liquid described above to an amount of 5% by volume. The "inking-up" quality of the samples was evaluated by counting the number of copies that had to be disposed of before a steady, perfect black print could be obtained. The results in table 1 indicate that the improved hydrophilicity of the printing plates comprising block copolymer Plm-1 used according to the present invention does not affect the ink-acceptance of such plates adversely. On the contrary, the "inking-up" quality of the samples no. 4 and 5 is even slightly improved compared to samples which do not comprise a hydrophilic amphoteric block copolymer used according to the present invention.

TABLE 1

| Sample no. | Amount polymer in image receiving layer | Toning | Inking-up |
|---|---|---|---|
| 1 (comp.) | | >300 | 50 |
| 2 (comp.) | 4 $mg/m^2$ PAA | ±100 | 50–75 |
| 3 (comp.) | 4 $mg/m^2$ PANS | ±100 | 65 |
| 4 (inv.) | 2 $mg/m^2$ Plm-1 | 50 | 50 |
| 5 (inv.) | 4 $mg/m^2$ Plm-1 | 1 | 40 |

Having described in detail preferred embodiments of the current invention, it will now be apparent to those skilled in the art that numerous modifications can be made therein without departing from the scope of the invention as defined in the following claims.

We claim:

1. An imaging element for making a lithographic printing plate comprising on one side of a support a photosensitive layer containing a silver halide emulsion and an image receiving layer containing physical development nuclei in water permeable relationship with said photosensitive layer, said imaging element further comprising a hydrophilic amphoteric block copolymer containing (i) a non-ionic acrylic block comprising a sequence of units having pendant nitrile groups according to formula I and (ii) a acrylamid (in)ic block comprising a sequence of units according to formula II, and said hydrophilic amphoteric block copolymer further comprising within said acrylamid(in)ic block(s) units having pendant acidic groups or salts thereof as well as units having pendant basic groups or salts thereof Formula I

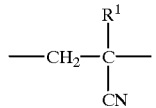

wherein $R^1$ is hydrogen or an alkyl group;

Formula II

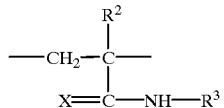

wherein $R^2$ is hydrogen or an alkyl group, $R^3$ is hydrogen, an alkyl group or an aryl group and X is O or NH.

2. An imaging element according to claim 1 wherein the units having pendant acidic groups correspond to formula III or IV:

Formula III

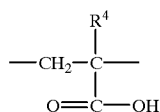

wherein $R^4$ is hydrogen or an alkyl group;

Formula IV

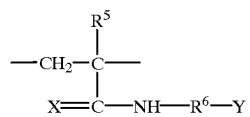

wherein $R^5$ is hydrogen or an alkyl group, X is O or NH, $R^6$ is an organic linking group having at least one carbon atom and —Y is —COOH, —OPO$_3$H, —SO$_3$H or —OSO$_3$H.

3. An imaging element according to claim 1 wherein the units having pendant basic groups correspond to formula V or VI:

Formula V

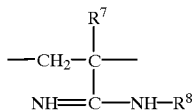

wherein $R^7$ is hydrogen or an alkyl group and $R^8$ is hydrogen, an alkyl group or an aryl group;

Formula VI

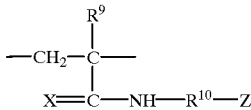

wherein $R^9$ is hydrogen or an alkyl group, X is O or NH, $R^{10}$ is an organic linking group having at least one carbon atom and Z is a nitrogen containing base.

4. An imaging element according to claim 2 wherein the hydrophilic amphoteric block copolymer comprises N-(2-sulphoethyl)-acrylamide and N-(2-sulphoethyl)-acrylamidine units.

5. An imaging element according to claim 1 wherein the hydrophilic amphoteric block copolymer is present in the image receiving layer.

6. An imaging element according to claim 1 wherein the photosensitive layer is present between the support and the image receiving layer.

7. An imaging element according to claim 1 wherein the image receiving layer is present between the support and the photosensitive layer.

8. A method for making a lithographic printing plate comprising the steps of (i) image-wise exposing an imaging element comprising on one side of a support a photosensitive layer containing a silver halide emulsion and an image receiving layer containing physical development nuclei in water permeable relationship with said photosensitive layer, and then (ii) processing the exposed imaging element according to the silver salt diffusion transfer reversal process, characterized in that said processing comprises the step of treating the imaging element with a processing solution containing a hydrophilic amphoteric block copolymer as defined in claim 1.

9. A method according to claim 8 wherein the processing solution is an alkaline processing liquid, a neutralizing liquid, a rinsing liquid, a finishing liquid, a correcting liquid or a correcting gel.

* * * * *